US006211702B1

(12) United States Patent
Nagatome (10) Patent No.: US 6,211,702 B1
(45) Date of Patent: Apr. 3, 2001

(54) INPUT CIRCUIT (75) Inventor: Toshihide Nagatome, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/188,212

(22) Filed: Nov. 9, 1998

(30) Foreign Application Priority Data

May 6, 1998 (JP) .................................................. 10-123466

(51) Int. Cl.$^7$ .................. H03K 19/094; H03K 19/0175
(52) U.S. Cl. ................................ 326/83; 326/113; 326/57
(58) Field of Search .............................. 326/83, 113, 56, 326/57, 58, 22, 23, 24

(56) References Cited

U.S. PATENT DOCUMENTS

| | | | |
|---|---|---|---|
| 3,739,193 | * | 6/1973 | Pryor ..................................... 326/113 |
| 3,812,384 | * | 5/1974 | Skorup ................................... 365/154 |
| 4,451,745 | * | 5/1984 | Itoh et al. ............................... 326/83 |
| 5,132,577 | * | 7/1992 | Ward ..................................... 326/110 |
| 5,404,151 | * | 4/1995 | Asada ................................... 345/100 |
| 5,739,701 | * | 4/1998 | Oshima ................................. 326/82 |
| 5,760,608 | * | 6/1998 | Naffziger et al. ...................... 326/86 |

OTHER PUBLICATIONS

Rhyne, "Fundamentals of Digital Systems Design", N.J. pp. 70–71, 1973.*

* cited by examiner

Primary Examiner—Michael Tokar
Assistant Examiner—Daniel D. Chang
(74) Attorney, Agent, or Firm—Jones Volentine, L.L.C.

(57) ABSTRACT

An input circuit is provided with a gate with an input end thereof connected to an input terminal to which an external signal is input, the gate allows or prohibits the output of the external signal in accordance with a control signal. The input circuit also includes a latch circuit that holds the output from the gate and outputs the signal thus held to an internal input terminal. This structure prevents any inflow of a through current, and prevents erroneous operation of an internal circuit resulting from change in the signal level at the internal input terminal.

7 Claims, 6 Drawing Sheets

(A) input terminal 100

(B) gate control signal E (C) internal input terminal 102

FIG. 4

(A) input terminal 100

(B) gate control signal E (C) potential at point A (D) internal input terminal 102

(A) input terminal 100

(B) gate control signal E    "H"

(C) potential at point A (D) internal input terminal 102

FIG. 12
PRIOR ART (A) input terminal 100

(B) gate control signal E (C) internal input terminal 102

INPUT CIRCUIT

FIELD OF THE INVENTION

1. Background of the Invention

The present invention relates to an input circuit for a microcomputer or the like.

2. Description of the Related Art

Figure 11:
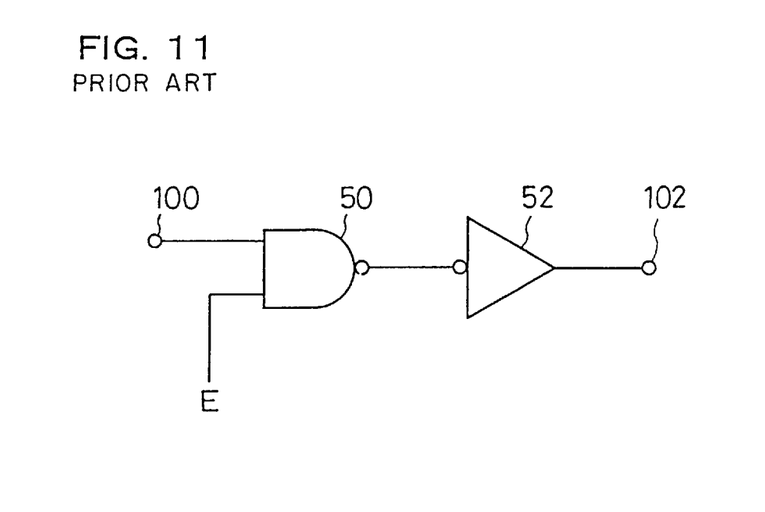
FIG. 11 is a circuit diagram illustrating a structural example of an input circuit in the prior art.

An input circuit for a microcomputer or the like in the prior art normally assumes a circuit structure such as that illustrated in FIG. 11 to ensure that no through current flows into internal circuits when no input signal is provided from the outside such as at the time of a reset or in the low power consumption mode (stop mode) during which the clock is stopped, i.e., when the input terminal achieves a state of high impedance.

As illustrated in the figure, the input circuit provided between an input terminal 100 through which a signal is input from the outside and an internal input terminal 102 for inputting the signal to an internal circuit comprises a NAND gate 50 with one input end thereof connected to the input terminal 100 and a gate control signal E input to another input end thereof and an inverter 52 that inverts an output signal from the NAND gate 50 to input it to the internal input terminal 102. The gate control signal E allows or prohibits the input of a signal which is to be input to the internal input terminal 102 from the outside via the input terminal 100. When the gate control signal E is at high, the input of an input signal from the outside is allowed, whereas when it is at low, a state of high impedance is set for the NAND gate 50 to prohibit the input of the input signal. In addition, the NAND gate 50 is constituted so that any through current is prevented even when it is set in a state of high impedance by the gate control signal E.

Figure 12:
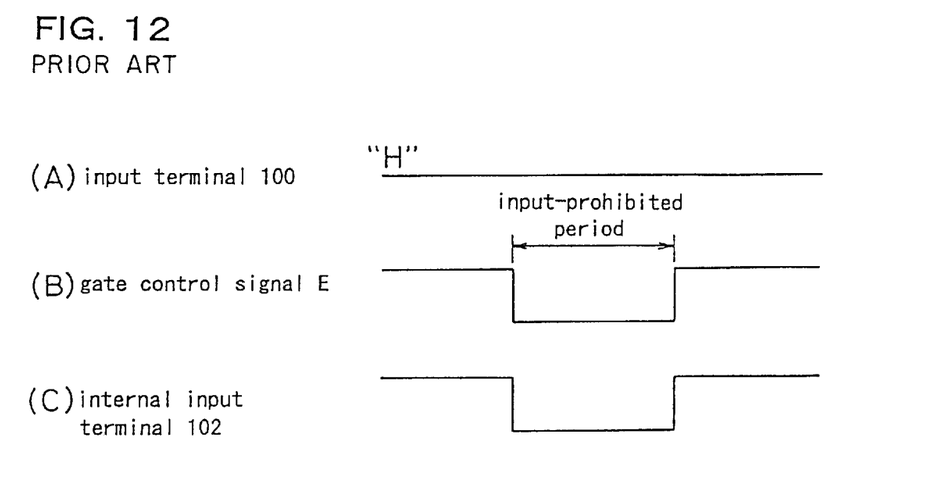
FIG. 12 is a timing chart illustrating an example of an operating state of the input circuit illustrated in FIG. 11.

As illustrated in FIG. 12, when the gate control signal E is set to low to prohibit signal input from the outside in the input circuit in the prior art, the internal input terminal 102 is fixed at low. However, when the signal level of the signal input to the input terminal 100 is at high before or after a period during which the signal input is prohibited, a change occurs in the signal level at the internal input terminal 102 which, depending upon the structure of an internal circuit which is connected to the internal input terminal 102, sometimes results in an erroneous operation of an internal circuit.

SUMMARY OF THE INVENTION

A first object of the present invention, which has been completed by addressing the problem of the prior art discussed above, is to provide an input circuit in which a through current is prevented from flowing.

A second object of the present invention is to provide an input circuit with which any erroneous operation of a connected internal circuit can be prevented even when there is a change in the level of the input signal.

In order to achieve the objects described above, the input circuit according to the present invention is provided with an input gate which, in conformance with a control signal, is capable of allowing or prohibiting the output of a first signal that is based upon an input signal, and a latch circuit that holds the first signal and is capable of outputting a second signal based upon the first signal to an internal circuit.

This structure makes it possible to prevent any through current from flowing in the input circuit in an input-prohibited state in which the input of an input signal is prohibited at the input gate by the control signal.

In addition, since the signal level of the first signal is held by the latch circuit, any changes in the signal level of the second signal can be prevented. Thus, any erroneous operation of an internal circuit is prevented from occurring due to changes in the signal level of the second signal.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENT

Figure 1:
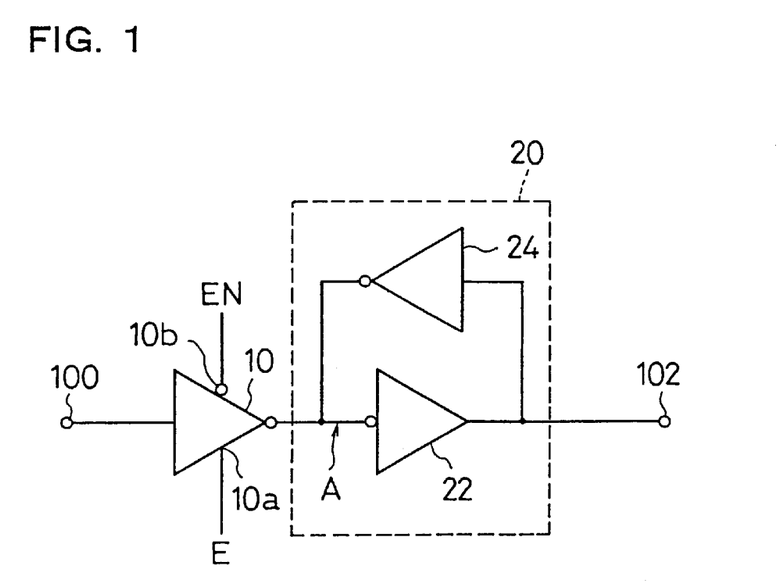
FIG. 1 is a circuit diagram illustrating the structure of the input circuit in a first embodiment of the present invention.

The following is a detailed explanation of the preferred embodiments of the present invention in reference to the drawings. FIG. 1 shows the structure of the input circuit in the first embodiment of the present invention. As shown in the figure, the input circuit comprises a three-state gate 10 and a latch circuit 20. An input end of the three-state gate 10 is connected to an input terminal 100 to which a signal is input from the outside, and an output end of the three-state gate 10 is connected to an input end of an inverter 22. In addition, an output end of the inverter 22 is connected with an internal input terminal 102 that is connected to an internal circuit. An input end of an inverter 24 is connected to the output end of the inverter 22, with an output end thereof connected to the input end of the inverter 22.

It is to be noted that the three-state gate 10 constitutes the input gate according to the present invention, with the inverters 22 and 24 respectively constituting a first gate and a second gate according to the present invention.

Figure 2:
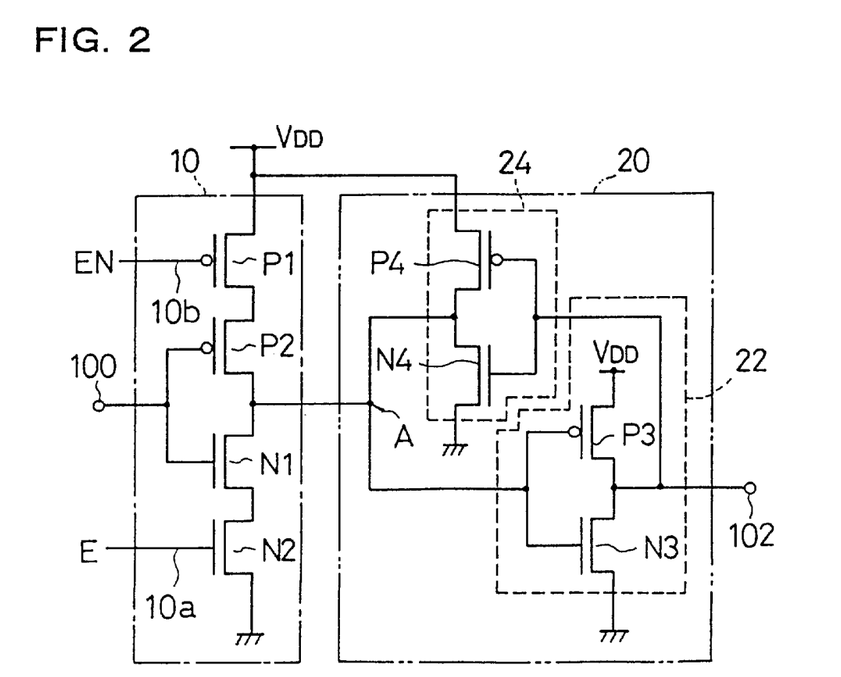
FIG. 2 is a circuit diagram illustrating a specific structural example of the input circuit in FIG. 1.

A specific structure of the input circuit in FIG. 1 is illustrated in FIG. 2. In the figure, the three-state gate 10 is constituted of PMOS transistors P1 and P2 and NMOS transistors N1 and N2, with the source of the PMOS transistor P1 connected to a source line VDD and the drain of the PMOS transistor P1 connected to the source of the PMOS transistor P2. The drain of the PMOS transistor P2 is connected to the drain of the NMOS transistor N1, whereas the gate of the PMOS transistor P2 is connected to the gate of the NMOS transistor N1 and the input terminal 100.

The source of the NMOS transistor N1 is connected to the drain of the NMOS transistor N2, with the source of the NMOS transistor N2 grounded.

In addition, a structure is assumed for the three-state gate 10 so that a gate control signal E is input to the gate of the NMOS transistor N2 and that a gate control signal EN constituted of the logically inverted gate control signal E is input to the gate of the PMOS transistor P1. The latch circuit 20 comprises the inverter 22 constituted of a PMOS transistor P3 and an NMOS transistor N3 and the inverter 24 constituted of a PMOS transistor P4 and an NMOS transistor N4, with the source of the PMOS transistor P3 connected to the source line VDD, the drain of the PMOS transistor P3 connected to the drain of the NMOS transistor N3 and the gate of the PMOS transistor P3 connected to the gate of the NMOS transistor N3.

The drain of the NMOS transistor N3 is connected to the internal input terminal 102, whereas the source of the NMOS transistor N3 is grounded. Furthermore, the source of the PMOS transistor P4 is connected to the source line VDD, its drain is connected to the drain of the NMOS transistor N4 and its gate is connected to the gate of the NMOS transistor N4, with the source of the NMOS transistor N4 grounded. The drain of the PMOS transistor P3 is connected to the gate of the NMOS transistor N4, and the gate of the PMOS transistor P3 is connected to the drain of the PMOS transistor P4 and the drain of the PMOS transistor P2.

When the three-state gate 10 is operated to enter an input-allowed state by setting the gate control signal E to high and the gate control signal EN to low, a signal input to the input terminal 100 from the outside is transmitted to the internal input terminal 102, and its signal level is held at the latch circuit 20.

Figure 3:
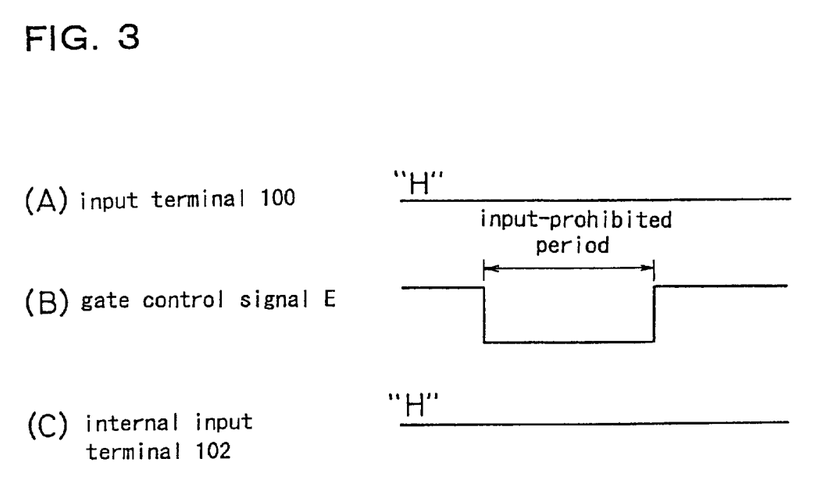
FIG. 3 is a timing chart presenting an example of an operating state of the input circuit illustrated in FIGS. 1 and 2.

Consequently, since the signal level at the input terminal 100 immediately before an input-prohibited period, i.e., immediately before a period during which the gate control signal E is set to low, is held at the latch circuit 20, as illustrated in FIG. 3, no change in the signal level occurs at the internal input terminal 102.

In addition, in the input-prohibited state, since the gate control signal E is at low and the gate control signal EN is at high, both the PMOS transistor P1 and the NMOS transistor N2 are set in a state of non-continuity. Thus, the NMOS transistor N1 and the PMOS transistor P2 are set in a non-operating state so that no through current flows from the input terminal 100 into the three-state gate 10 even if the input terminal 100 enters the state of high impedance.

Figure 4:
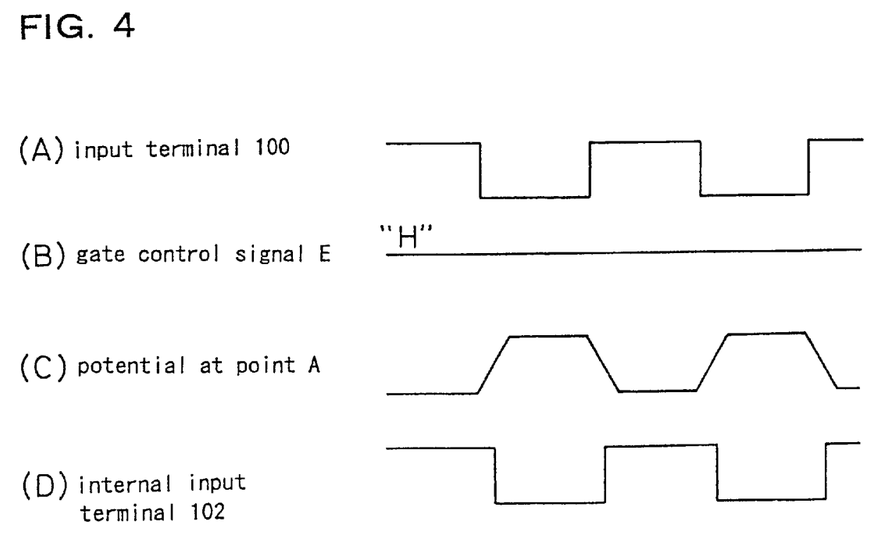
FIG. 4 is a timing chart illustrating another example of an operating state of the input circuit illustrated in FIGS. 1 and 2.

When the signal level at the input terminal 100 has changed in the input-allowed state, i.e., in a state in which the gate control signal E is at high, the so-called Schmidt characteristics (hysteresis characteristics at the threshold level) can be achieved for the signal input through the input terminal 100 by connecting the output end of the three-state gate 10 and the output end of the inverter 24, as illustrated in FIG. 4. When the signal level at the input terminal 100 shifts from low to high or from high to low, the electrical potential at point A, at which the output end of the three-state gate 10 and the output end of the inverter 24 are connected to each other (see FIG. 4 (A)) gently changes relative to the change in the signal level at the input terminal 100 (see FIG. 4 (C)) due to the influence of the on-resistances of the PMOS transistor P4 and the NMOS transistor N4 constituting the inverter 24, so that the signal that has been input to the input terminal 100 is communicated with a slight delay to the internal input terminal 102 (see FIG. 4 (D)). Even when noise is imposed upon the input signal, an internal circuit is less likely to be subject to its effect because of the Schmidt characteristics described above.

As explained above, in the input circuit in the first embodiment of the present invention, which employs the three-state gate 10 to constitute its input gate with the input end of the three-state gate 10 connected to the input terminal and the latch circuit 20 provided between the output end of the three-state gate 10 and the internal input terminal, a through current is prevented from flowing into an internal circuit connected to the internal input terminal by the three-state gate 10 when the three-state gate 10 is in the input-prohibited state even when the input terminal is in a state of high impedance.

In addition, in the input-prohibited state, since the signal level immediately before the prohibition of input is held at the latch circuit 20, the signal level can be prevented from changing at the internal input terminal, before or after an input-prohibited period. Thus, any erroneous operation of an internal circuit resulting from unnecessary change in the signal level can be prevented.

Furthermore, the input circuit in the first embodiment adopts the structure achieved by connecting the output end of the three-state gate 10 and the output end of the inverter 24 constituting the latch circuit 20. Through this structure, in which the three-state gate 10 in the input-allowed state outputs a signal having Schmidt characteristics to the latch circuit 20 based upon the signal input through the input terminal 100, an input circuit which is less easily subject to the adverse effect of noise is realized, as a result.

Figure 5:
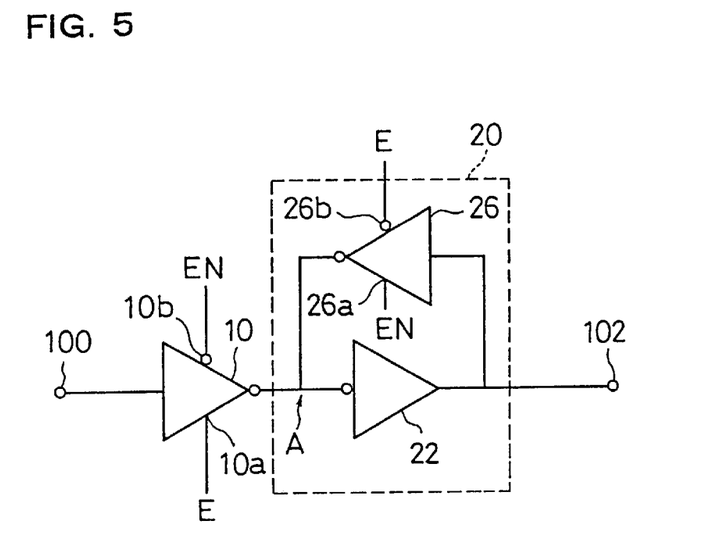
FIG. 5 is a circuit diagram illustrating the structure of the input circuit in a second embodiment of the present invention.

Next, the structure of the input circuit in the second embodiment of the present invention is illustrated in FIG. 5. The input circuit in this embodiment is achieved by providing a three-state gate 26 in place of the inverter 24 constituting the latch circuit 20 in the input circuit in the first embodiment illustrated in FIG. 1, and other structural features are almost identical to those of the input circuit in the first embodiment. A gate control signal E is input to gate control terminals 10a and 26b of the three-state gates 10 and 26 respectively, whereas a gate control signal EN constituted of a logically inverted signal of the gate control signal E is input to gate control terminals 10b and 26a of the three-state gates 10 and 26 respectively.

It is to be noted that the three-state gate 26 is equivalent to the second gate according to the present invention.

When the gate control signal E is set to high and the gate control signal EN is set to low, the three-state gate 10 enters a state for allowing signal input through the input terminal and the output end of the three-state gate 26 achieves a state of high impedance.

Figure 6:
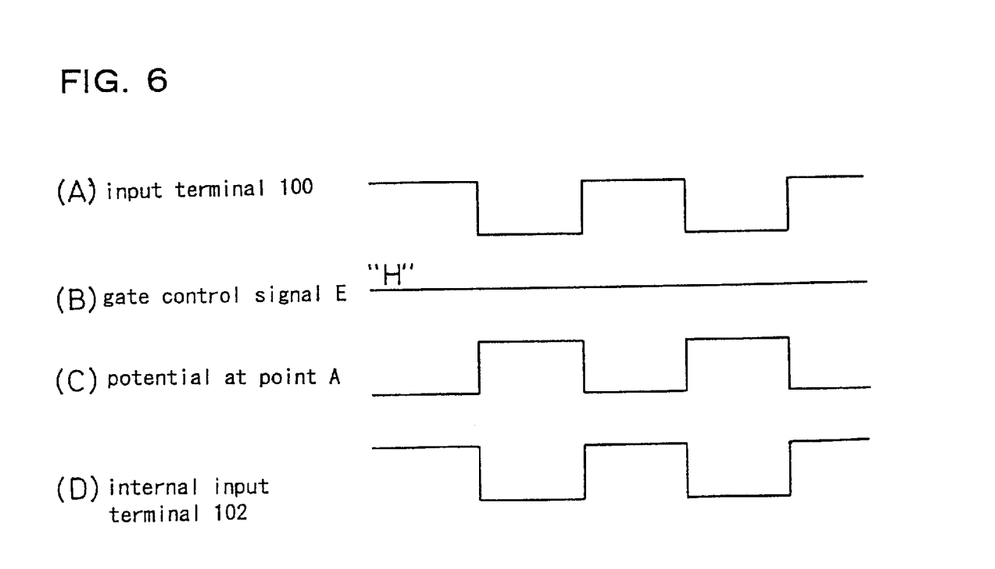
FIG. 6 is a timing chart illustrating an example of an operating state of the input circuit illustrated in FIG. 5.

As illustrated in FIG. 6, in response to a change in the signal level at the input terminal 100 (see FIG. 6 (A)), the electrical potential at point A at which the output end of the three-state gate 10 and the input end of the inverter 22 are connected with each other is set to a level achieved by logically inverting the signal level at the input terminal 100 (see FIG. 6 (C))

Since the electrical potential at point A is logically inverted by the inverter 22, the signal level at the internal input terminal 102 is set the same as the signal level at the input terminal 100, as a result (see FIG. 6 (D)).

In addition, when the gate control signal E is set to low and the gate control signal EN is set to high, the output of the three-state gate 10 achieves a state of high impedance and the three-state gate 26 enters an active state. In this case, the three-state gate 10 is set in a state for prohibiting signal input from the input terminal 100, with the inverter 22 and the three-state gate 26 functioning as a latch circuit. Consequently, the signal level at the input terminal 100 immediately before the input-prohibited state is set is held at the latch circuit 20.

With the input circuit in the second embodiment of the present invention, since the output of the three-state gate 26 is set in a state of high impedance when signal input from the outside is allowed, the delay of the signal transmitted from the input terminal 100 to the internal input terminal 102 is reduced and, at the same time, it becomes possible to reduce the current consumption.

Furthermore, in the input circuit in the second embodiment, a change in the signal level at the internal input terminal 102 before or after an input-prohibited period can be prevented as in the input circuit in the first embodiment. Thus, any erroneous operation of an internal circuit resulting from unnecessary change in the signal level is prevented.

Figure 7:
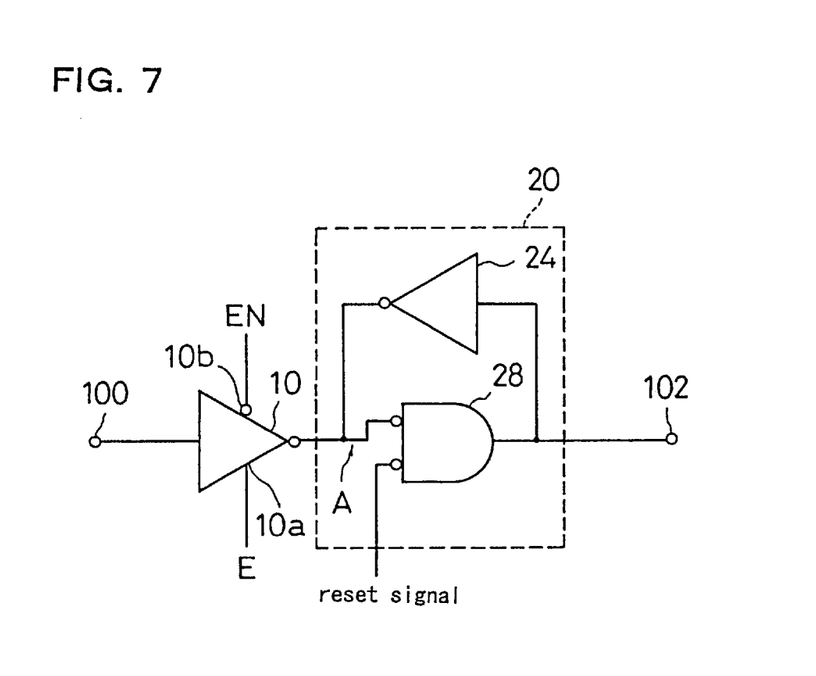
FIG. 7 is a circuit diagram illustrating the structure of the input circuit in a third embodiment of the present invention.

The structure of the input circuit in the third embodiment of the present invention is illustrated in FIG. 7. The input circuit in this embodiment is constituted by providing a NOR gate 28 in place of the inverter 22 in the input circuit in the first embodiment illustrated in FIG. 1 and a reset signal is input to an input end of the NOR gate 28, and other structural features are almost identical to those in the input circuit in the first embodiment. The output end of the three-state gate 10 is connected to one of the inputs of the NOR gate 28. In addition, a reset signal is input to another input end of the NOR gate 28. The output end of the NOR gate 28 is connected to an input end of the inverter 24 and the internal input terminal 102.

Figure 8:
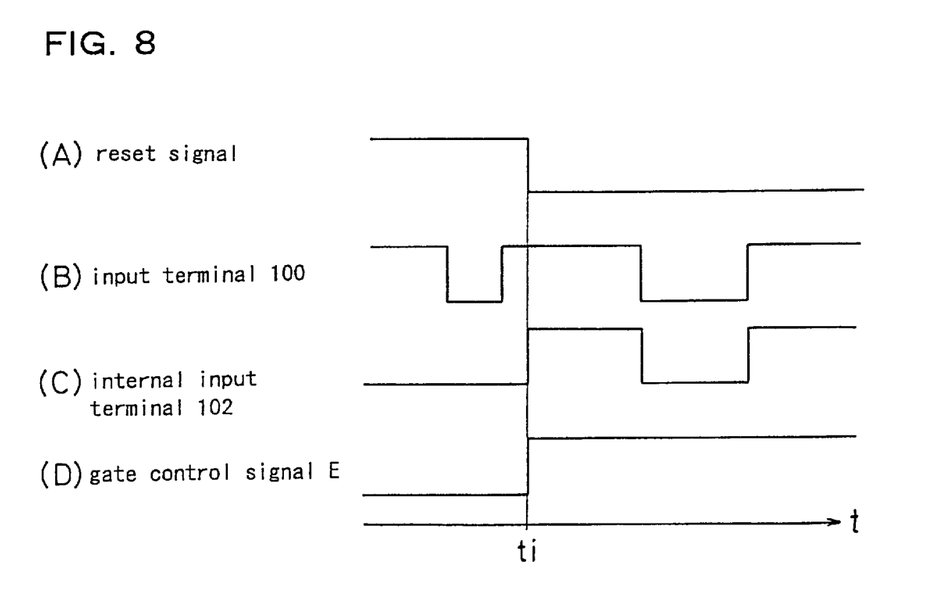
FIG. 8 is a timing chart presenting an example of an operating state of the input circuit illustrated in FIG. 7.

As illustrated in FIG. 8, the reset signal is set to high during the initial operating stage of the input circuit in the third embodiment, and during this period, the internal input terminal 102 is fixed at low regardless of the state of the gate control signal E which controls the three-state gate 10.

When the reset signal shifts from high to low, and the gate control signal E is set to high at a time point ti, the three-state gate 10 enters an input-allowed state in which signal input from the input terminal 100 is allowed and the NOR gate 28 functions as an inverter which inverts the logic of the output signal from the three-state gate 10. As a result, following the time point ti, any change in the signal level at the input terminal 100 is directly communicated to the internal input terminal 102.

When the reset signal is set to low and the three-state gate 10 is in an input-prohibited state, i.e., when the gate control signal E is set to low (the gate control signal EN is set to high), the inverter 24 and the NOR gate 28 function as the latch circuit 20 which holds the output from the three-state gate 10, i.e., the signal level at the input terminal 100, immediately before it enters the input-prohibited state.

As explained above, in the input circuit in the third embodiment of the present invention, an internal circuit can be initialized by providing a low level signal to an internal circuit connected to the internal input terminal 102.

In addition, in the input circuit in the third embodiment, any change in the signal level at the internal input terminal 102 before or after an input-prohibited period can be prevented as in the input circuit in the first embodiment. Thus, any erroneous operation of an internal circuit resulting from unnecessary change in the signal level can be prevented.

Figure 9:
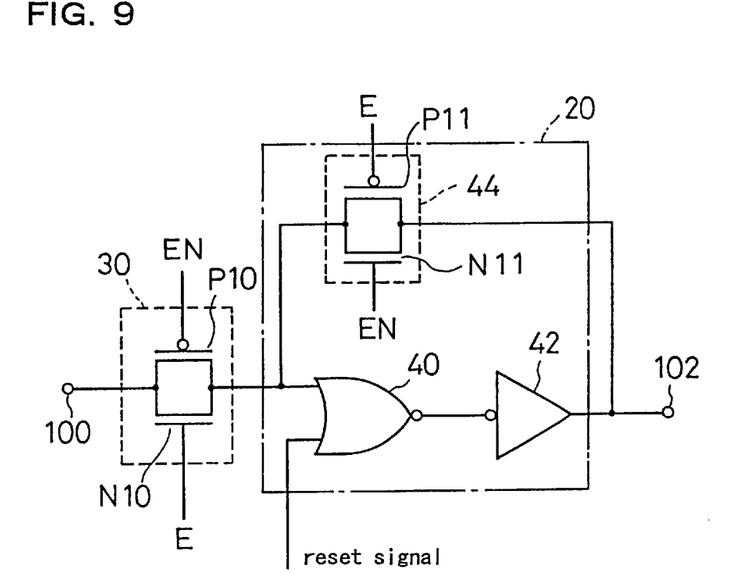
FIG. 9 is a circuit diagram illustrating the structure of the input circuit in a fourth embodiment of the present invention.

FIG. 9 illustrates the structure of the input circuit in the fourth embodiment of the present invention. The input circuit in this embodiment is achieved by providing a NOR gate 40 and an inverter 42 in place of the inverter 22 and transfer gates 30 and 44 in place of the three-state gates 10 and 26 respectively in the input circuit in the second embodiment illustrated in FIG. 5. A reset signal is input to one of the input ends of the NOR gate 40. Other structural features are almost identical to those of the input circuit in the second embodiment.

One input terminal of the NOR gate 40 is connected to the input terminal 100 via the transfer gate 30, with the reset signal input to another input terminal of the NOR gate 40. An output end of the NOR gate 40 is connected to the internal input terminal 102 via the inverter 42. The output end of the inverter 42 is connected to the output end of the transfer gate 30 and one of the input ends of the NOR gate 40 via the transfer gate 44.

The transfer gate 30 is constituted of a PMOS transistor P10 and an NMOS transistor N10, whereas the transfer gate 44 is constituted of a PMOS transistor P11 and an NMOS transistor N11. In addition, a gate control signal E is input to the gates of the NMOS transistor N10 and the PMOS transistor P11, and a gate control signal EN constituted of a logically inverted signal of the gate control signal E is input to the gates of the PMOS transistor P10 and the NMOS transistor N11.

Figure 10:
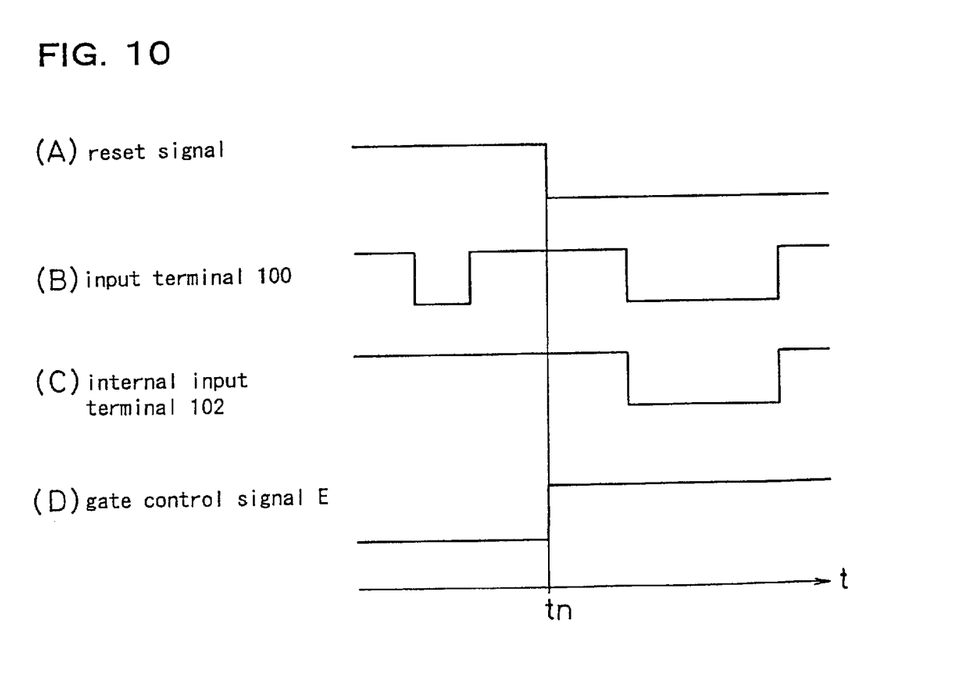
FIG. 10 is a timing chart presenting an example of an operating state of the input circuit illustrated in FIG. 9.

As illustrated in FIG. 10, the reset signal is set to high during the initial operating stage of the input circuit in the fourth embodiment, and during this period, the internal input terminal 102 is fixed at high regardless of the state of the gate control signal E which controls the transfer gate 30.

When the reset signal shifts from high to low and the gate control signal E is set to high at a time point tn, the transfer gate 30 enters an input-allowed state in which signal input from the input terminal 100 is allowed and the NOR gate 40 functions as an inverter that inverts the logic of the output signal from the transfer gate 30. In addition, the logic of the output signal from the NOR gate 40 is inverted by the inverter 42. Thus, following the time point tn, any change in the signal level at the input terminal 100 is directly communicated to the internal input terminal 102.

When the reset signal is set to low and the transfer gate 30 is in an input-prohibited state, i.e., when the gate control signal E is at low (the gate control signal EN is at high), the transfer gate 44, the NOR gate 40 and the inverter 42 function as a latch circuit 20, which holds the output from the three-state gate 10, i.e., the signal level at the input terminal. 100 immediately before the input-prohibited state is set.

As explained above, in the input circuit in the fourth embodiment of the present invention, an internal circuit can be initialized by providing a high level signal to an internal circuit that is connected to the internal input terminal 102.

In addition, the input circuit in the fourth embodiment can be constituted by employing a smaller number of transistors compared to the input circuit in the second embodiment.

Moreover, in the input circuit in the fourth embodiment, any change in the signal level at the internal input terminal 102 can be prevented before and after an input-prohibited period, as in the input circuit in the first embodiment. Consequently, any erroneous operation of an internal circuit resulting from unnecessary change in the signal level can be prevented.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while the circuit illustrated in FIG. 2 is given as a specific structural example of the input circuit in the first embodiment of the present invention, the present invention is not restricted to such a circuit structure.

In addition, while, in the third embodiment, a reset function is fulfilled by employing the NOR gate 28 instead of the inverter 22 in the input circuit shown in FIG. 1, the reset function may instead be realized by employing the NOR gate 28 in place of the inverter 24 in FIG. 1.

Furthermore, while two three-state gates are employed in the second embodiment and two transfer gates are employed in the fourth embodiment, a three-state gate and a transfer gate may be employed in combination in these embodiments.

Moreover, while the internal input terminal 102 is initialized at low level by the reset signal in the third embodiment, an inverter or the like may be added to the structure so that the internal input terminal is initialized at high level.

Also, while the internal input terminal 102 is initialized at high level by the reset signal in the fourth embodiment, an inverter or the like may be added to the structure to initialize the internal input terminal to low level.

As has been explained in detail, according to the present invention, which provides an input circuit having an input gate capable of prohibiting, in conformance to a control signal, the input of an input signal or the output of a first signal that is based upon the input signal, no through current is allowed to flow into the input circuit in an input-prohibited state during which the input of the input signal is prohibited, to achieve a great reduction in power consumption.

In addition, since the input circuit according to the present invention is provided with a latch circuit capable of holding the first signal and outputting a second signal based upon the first signal to an internal circuit, any erroneous operation of an internal circuit resulting from change in the signal level of the second signal can be prevented.

The entire disclosure of Japanese Patent Application No. 10-123466 filed on May 6, 1998 including specification, claims, drawings and summary is incorporated herein by reference in its entirety.

What is claimed is:

1. An input circuit connected between an input port and an output port, comprising:
    a three-state inverter coupled to receive a control signal and connected to receive an input signal from the input port, said three-state inverter outputs a first signal as having a voltage level that is an inversion of a voltage level of the input signal when the control signal has a first voltage level and outputs the first signal as having a high impedance state when the control signal has a second voltage level,
    said three-state inverter having at least first, second and third MOS transistors coupled in series, the first and second MOS transistors being a same electrical type, gate electrodes of the second and third MOS transistors being coupled to receive the input signal, and a gate electrode of the first MOS transistor being coupled to receive the control signal; and
    a latch circuit coupled to said three-state inverter, said latch circuit provides an output signal to the output port, said latch circuit comprising
        a logic circuit having first and second input terminals and an output terminal, the first input terminal being coupled to receive the first signal and the second input terminal being coupled to a reset signal, said logic circuit provides at the output terminal the output signal as having a voltage level that is an inversion of the voltage level of the first signal when a voltage level of the reset signal is a third voltage level and provides at the output terminal the output signal as having a predetermined voltage level when the voltage level of the reset signal is a fourth voltage level, and
        an inverter having input and output terminals, the input terminal of said inverter being coupled to the output terminal of said logic circuit and the output terminal of said inverter being coupled to the first input terminal of said logic circuit.

2. The input circuit of claim 1, wherein said logic circuit is a NAND gate.

3. The input circuit of claim 1, wherein said three-state inverter further comprises a fourth MOS transistor coupled in series with the third MOS transistor, a gate electrode of the fourth MOS transistor being coupled to an inversion of the control signal.

4. The input circuit of claim 1, wherein the reset signal and the control signal are independent of each other.

5. An input circuit connected between an input port and an output port, comprising:
    a first transfer gate coupled to receive a control signal and connected to receive an input signal from the input port, said first transfer gate outputs a first signal as having a voltage level that is the same as a voltage level of the input signal when a voltage level of the control signal has a first voltage level and outputs the first signal as having a high impedance state when the voltage level of the control signal has a second voltage level; and
    a latch circuit coupled to said first transfer gate, said latch circuit provides an output signal to the output port, said latch circuit comprising
        a logic circuit having first and second input terminals and an output terminal, the first input terminal being coupled to receive the first signal and the second input terminal being coupled to receive a reset signal, said logic circuit provides at the output terminal a second signal as having a voltage level that is an inversion of the voltage level of the first signal when a voltage level of the reset signal is a third voltage level and provides at the output terminal the second signal as having a predetermined voltage level when the voltage level of the reset signal is a fourth voltage level,
        an inverter having input and output terminals, the input terminal of said inverter being coupled to the output terminal of said logic circuit, said inverter provides at the output terminal of said inverter connected to the output port the output signal as having a voltage level that is an inversion of the voltage level of the second signal, and
        a second transfer gate coupled to receive the control signal and connected between the output terminal of said inverter and the first input terminal of said logic circuit, said second transfer gate outputs to said logic circuit a third signal as having a voltage level that is the same as the voltage level of the output signal when the voltage level of the control signal has the second voltage level and outputs to said logic circuit the third signal as having a high impedance state when the voltage level of the control signal is the first voltage level.

6. The input circuit of claim 5, wherein said logic circuit is a NOR gate.

7. The input circuit of claim 5, wherein the reset signal and the control signal are independent of each other.

* * * * *